United States Patent
Hakamata

(10) Patent No.: US 6,204,556 B1
(45) Date of Patent: Mar. 20, 2001

(54) STRUCTURE FOR AND METHOD OF MOUNTING IMAGE TAKING ELEMENT ON SUBSTRATE

(75) Inventor: Kazuo Hakamata, Kanagawa-ken (JP)

(73) Assignee: Fuji Photo Film Co., Ltd., Kanagawa (JP)

(*) Notice: Subject to any disclaimer, the term of this patent is extended or adjusted under 35 U.S.C. 154(b) by 0 days.

(21) Appl. No.: 09/261,200

(22) Filed: Mar. 3, 1999

(30) Foreign Application Priority Data

Mar. 3, 1998 (JP) ................................................ 10-050498

(51) Int. Cl.[7] ............................ H01L 27/14; H01L 23/24; H01L 33/00; H01L 21/288; H01L 23/493
(52) U.S. Cl. ........................... 257/728; 257/99; 257/434; 257/435; 257/79; 257/680; 257/668; 257/725; 257/724; 257/704; 257/710; 257/773; 438/119; 438/613
(58) Field of Search ................................ 257/678, 703, 257/704, 728, 710, 730, 729, 725, 778, 773, 797, 698, 99, 79, 435, 434; 438/119, 613

(56) References Cited

U.S. PATENT DOCUMENTS

| | | | |
|---|---|---|---|
| 5,019,201 | * | 5/1991 | Yabu et al. ........................ 156/273.9 |
| 5,463,216 | * | 10/1995 | Berkel ................................ 250/208.1 |
| 5,576,239 | * | 11/1996 | Hatano et al. .......................... 438/69 |
| 5,728,253 | * | 3/1998 | Saito et al. ............................ 156/345 |
| 5,729,315 | * | 3/1998 | Takahashi et al. .................... 349/149 |
| 5,748,179 | * | 5/1998 | Ito et al. .............................. 349/152 |
| 5,769,996 | * | 6/1998 | McArdle et al. ..................... 252/500 |
| 5,786,589 | * | 7/1998 | Segawa et al. ................... 250/208.1 |
| 5,789,278 | * | 8/1998 | Akram et al. ......................... 438/118 |
| 5,827,755 | * | 10/1998 | Yonehara et al. ...................... 438/30 |
| 5,846,853 | * | 12/1998 | Otsuki et al. ......................... 438/119 |
| 6,002,180 | * | 12/1999 | Akram ................................. 257/783 |
| 6,011,294 | * | 1/2000 | Wetzel ................................ 257/434 |
| 6,018,167 | * | 1/2000 | Oota ...................................... 257/99 |
| 6,025,644 | * | 2/2000 | Imaeda .................................. 257/81 |
| 6,039,896 | * | 3/2000 | Miyamoto et al. ................... 252/511 |

FOREIGN PATENT DOCUMENTS

| | | | |
|---|---|---|---|
| 6-318688 | 11/1994 | (JP) | ................................ H01L/27/14 |
| 6-318689 | 11/1994 | (JP) | ................................ H01L/27/14 |

* cited by examiner

*Primary Examiner*—Alexander O. Williams
(74) *Attorney, Agent, or Firm*—Sughrue, Mion, Zinn, Macpeak & Seas, PLLC

(57) ABSTRACT

An image taking element has a plurality of pins on one side thereof and a substrate is provided with a plurality of pads which are to be brought into electrical contact with the pins. The side of the image taking element is bonded to the substrate with each pin opposed to one of the pads by way of an anisotropic conductive adhesive layer which exhibits electrical conductivity only in a direction substantially perpendicular to the side of the image taking element.

3 Claims, 1 Drawing Sheet

STRUCTURE FOR AND METHOD OF MOUNTING IMAGE TAKING ELEMENT ON SUBSTRATE

BACKGROUND OF THE INVENTION

1. Field of the Invention

This invention relates to a structure for and method of mounting an image taking element such as a CCD on a substrate.

2. Description of the Related Art

There have been in wide use image taking elements such as a CCD. Generally such an image taking element is provided with a plurality of pins for electrical connection on one side thereof and is mounted on a substrate provided with a plurality of pads for electrical connection with the pins on the element. Further there has been known a structure in which the pads are provided on the image taking element and the pins are provided on the substrate.

Recently there has been provided a back-exposure type image taking element which is provided with a sensor portion on one side thereof and with a light receiving face on the side opposite to said one side as disclosed, for instance, in Japanese Unexamined Patent Publication Nos. 6(1994)-318688 and 6(1994)-318689.

The back-exposure type image taking element is advantageous over the normal image taking elements, which have a light receiving face on the side on which the sensor portion is provided, in that they are higher in sensitivity and have sufficient sensitivity even for ultraviolet rays.

However since it is necessary that the distance between the light receiving face and the sensor portion is very small in order to obtain a sufficient sensitivity, the back-exposure type image taking element is very small in its overall thickness. Therefore the back-exposure type image taking element is apt to be damaged by external force when mounting the element on a substrate and mounting yield is very low.

Though methods of mounting such a back-exposure type image taking element are disclosed in Japanese Unexamined Patent Publication Nos. 6(1994)-318688 and 6(1994)-318689, these methods cannot substantially increase the mounting yield.

SUMMARY OF THE INVENTION

In view of the foregoing observations and description, the primary object of the present invention is to provide a structure and method which can mount at a high yield on a substrate an image taking element such as a back-exposure type image taking element which is not apt to be damaged.

In accordance with an aspect of the present invention, there is provided a structure for mounting an image taking element, which has on its one side one of a pin group and a pad group which are to be brought into electrical contact with each other, on a substrate which is provided with the other of the pin group and the pad group, wherein the improvement comprises that said one side of the image taking element is bonded to the substrate with each pin of the pin group opposed to one of the pads of the pad group by way of an anisotropic conductive adhesive layer which exhibits electrical conductivity only in a direction substantially perpendicular to said one side of the image taking element.

The anisotropic conductive adhesive layer may be suitably formed by use of thermosetting anisotropic conductive adhesive film exhibiting electrical conductivity only in the direction of thickness.

In accordance with another aspect of the present invention, there is provided a method of mounting an image taking element, which has on its one side one of a pin group and a pad group which are to be brought into electrical contact with each other, on a substrate which is provided with the other of the pin group and the pad group, wherein the improvement comprises the steps of positioning the image taking element and the substrate so that each pin of the pin group is opposed to one of the pads of the pad group, providing thermosetting anisotropic conductive adhesive film exhibiting electrical conductivity only in the direction of thickness between said one side of the image taking element and the substrate, and subsequently heating the thermosetting anisotropic conductive adhesive film to thermoset the same, thereby bonding said one side of the image taking element to the substrate.

It is possible to form a back-exposure type image taking element by polishing the side of the image taking element opposite to said one side thereof after the image taking element is bonded to the substrate and forming the side into a light receiving face.

In accordance with the present invention, since the image taking element is bonded to the substrate by way of a conductive adhesive layer, the image taking element is not subjected to a large external force during mounting on the substrate, whereby even the aforesaid back-exposure type image taking elements can be mounted at a high yield without damage due to external force.

Further since an anisotropic conductive adhesive layer which exhibits electrical conductivity only in a direction substantially perpendicular to said one side of the image taking element is employed as the conductive adhesive layer, only the pin and the pad which are opposed to each other are electrically connected by way of the adhesive layer and the pins and the pads which are not opposed cannot be electrically connected.

Further since the pins and the pads opposed to each other are electrically connected by way of the adhesive layer, the image taking element can be mounted on the substrate at relatively low cost as compared with when special bumps or the like are formed for electrical connection of the pins and pads.

Further when a back-exposure type image taking element is formed by polishing the side of the image taking element opposite to said one side thereof after the image taking element is bonded to the substrate and forming the side into a light receiving face, the polishing operation is facilitated since the image taking element has been fixed to the substrate, whereby manufacturing yield of the image taking element is increased.

DESCRIPTION OF THE PREFERRED EMBODIMENTS

Figure 1:
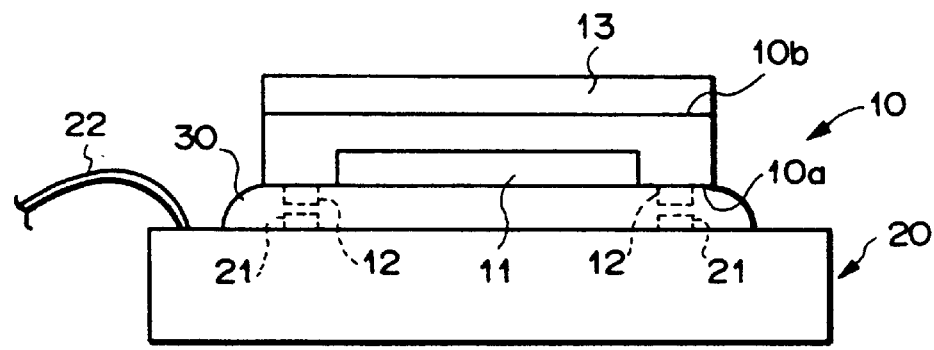
FIG. 1 is a side view showing a mounting structure for an image taking element in accordance with a first embodiment of the present invention.

FIG. 1 shows an image taking element mounting structure in accordance with a first embodiment of the present invention. In this embodiment, a back-exposure type image taking element 10, which may be, for instance, a CCD, is mounted on a substrate 20.

The back-exposure type image taking element 10 has a sensor portion 11 on one side 10a thereof. A plurality of pins 12 for electrical connection are mounted on the side 10a of the image taking element 10. The side 10b of the image taking element 10 opposite to the side 10a forms a light receiving face. UV coating 13 of $SiO_2$ film is provided over the light receiving face 10b. The substrate 20 is provided with a plurality of pads 21 which are brought into electrical contact with the pins 12 and a lead wire 22 which is in electrical contact with the pads 21.

The side 10a of the back-exposure type image taking element 10 is bonded to the substrate 20 with each pin 12 opposed to one of the pads 21 by way of an anisotropic conductive adhesive layer 30 which exhibits electrical conductivity only in a direction substantially perpendicular to the side 10a of the image taking element 10.

In this particular embodiment, the anisotropic conductive adhesive layer 30 is formed by thermosetting thermo-setting anisotropic conductive adhesive film exhibiting electrical conductivity only in the direction of thickness.

A method of forming the image taking element mounting structure of this embodiment will be described, hereinbelow. The image taking element 10 in a state where the thickness of the side 10b which forms the light receiving face is relatively large is pressed toward the substrate 20 with thermo-setting anisotropic conductive adhesive film intervening therebetween and with each of the pins 12 in alignment with predetermined ones of the pads 21.

As the thermo-setting anisotropic conductive adhesive film, for instance, thermo-setting anisotropic conductive adhesive film "CP8720IH" manufactured by Sony Chemical, or a screen mask provided with anisotropic adhesive "TG9001R-1H" manufactured by High Sole can be employed.

Thereafter the side 10a of the image taking element 10 is fixed to the substrate 20 by thermosetting the thermo-setting anisotropic conductive adhesive film.

Thereafter the side 10b of the image taking element 10 is mechanically and chemically polished so that the overall thickness of the image taking element 10 is reduced to about 15 to 30 $\mu$m (from the original thickness of about 500 $\mu$m). Thereafter by providing the UV coating 13 over the polished side 10b, a back-exposure type image taking element is finished.

Then a lead wire 22 such as of Au wire is connected to a contact (not shown) on the substrate 20.

In this embodiment, since an anisotropic conductive adhesive layer which exhibits electrical conductivity only in a direction substantially perpendicular to the side 10a of the image taking element 10 is employed as the anisotropic conductive adhesive layer 30, only the pins 12 and the pads 21 which are aligned with each other are electrically connected by way of the adhesive layer 30 and the pins and the pads which are not aligned with each other cannot be electrically connected.

Further since the image taking element 10 is polished after the image taking element 10 is fixed to the substrate 20, the polishing operation is facilitated, whereby manufacturing yield of the image taking element is increased.

Further, since the image taking element 10 is bonded to the substrate 20 by way of a conductive adhesive layer 30, the image taking element 10 is not subjected to a large external force during mounting on the substrate 20, and accordingly image taking elements can be mounted at a high yield without damage due to external force not only when the image taking element is polished after fixed to the substrate but also when the image taking element is polished before fixed to the substrate.

Figure 2:
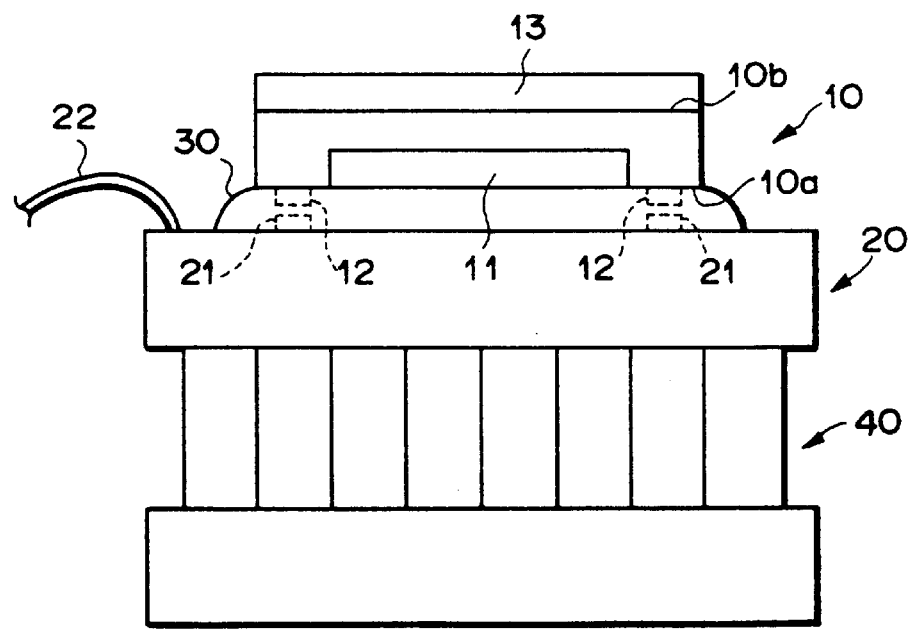
FIG. 2 is a side view showing a mounting structure for an image taking element in accordance with a second embodiment of the present invention.

The image taking element mounting structure in accordance with a second embodiment of the present invention shown in FIG. 2 is similar to the first embodiment shown in FIG. 1 except that a Peltier element 40 for cooling the back-exposure type image taking element 10 is mounted on the substrate 20.

As the thermo-setting anisotropic conductive adhesive film, those having a thickness of about 20 $\mu$m have been available. Accordingly, the adhesive layer 30 can be sufficiently small in thickness so that heat is well transferred from the image taking element 10 to the Peltier element 40 in order to efficiently cool the image taking element 10.

What is claimed is:

1. A structure for mounting an image taking element, which has on its one side one of a pin group and a pad group which are to be brought into electrical contact with each other, on a substrate which is provided with the other of the pin group and the pad group, wherein the improvement comprising:

said one side of said image taking element is directly bonded to said substrate with each pin of said pin group opposed to one of the pads of the pad group by way of an anisotropic conductive adhesive layer which exhibits electrical conductivity only in a direction substantially perpendicular to said one side of said image taking elements wherein said image taking element is of a back exposure type in which the distance between a light-receiving face and a sensor portion is substantially small.

2. A structure as defined in claim 1, wherein said anisotropic conductive adhesive layer is a thermosetting anisotropic conductive adhesive film exhibiting electrical conductivity only in a direction of thickness.

3. A structure as defined in claim 1, wherein said image taking element is fixed to one side of said substrate and a Peltier element is fixed to the other side of said substrate.

* * * * *